(12) United States Patent
Drachev et al.

(10) Patent No.: US 11,505,876 B2
(45) Date of Patent: *Nov. 22, 2022

(54) METHOD FOR PRODUCING BULK SILICON CARBIDE

(71) Applicant: GTAT Corporation, Hudson, NH (US)

(72) Inventors: Roman V. Drachev, Bedford, NH (US); Santhanaraghavan Parthasarathy, Tewksbury, MA (US); Andriy M. Andrukhiv, Hollis, NH (US); David S. Lyttle, Amherst, NH (US)

(73) Assignee: GTAT CORPORATION, Hudson, NH (US)

( * ) Notice: Subject to any disclaimer, the term of this patent is extended or adjusted under 35 U.S.C. 154(b) by 118 days.

This patent is subject to a terminal disclaimer.

(21) Appl. No.: 17/067,040

(22) Filed: Oct. 9, 2020

(65) Prior Publication Data

US 2021/0032770 A1 Feb. 4, 2021

Related U.S. Application Data

(63) Continuation of application No. 14/478,432, filed on Sep. 5, 2014, now Pat. No. 10,801,126.

(Continued)

(51) Int. Cl.
  *C30B 23/06* (2006.01)
  *C30B 23/02* (2006.01)
  *C30B 29/36* (2006.01)

(52) U.S. Cl.
  CPC .......... *C30B 23/066* (2013.01); *C30B 23/025* (2013.01); *C30B 29/36* (2013.01)

(58) Field of Classification Search
  CPC ...... C30B 23/025; C30B 23/066; C30B 29/36
  See application file for complete search history.

(56) References Cited

U.S. PATENT DOCUMENTS

| 5,944,890 A | 8/1999 | Kitou |
| 6,451,112 B1 | 9/2002 | Hara |

(Continued)

FOREIGN PATENT DOCUMENTS

| CN | 1570225 A | 1/2005 |
| CN | 102414349 A | 4/2012 |

(Continued)

OTHER PUBLICATIONS

Wang et al., Increase of SiC sublimation growth rate by optimizing of powder packaging, Journal of Crystal Growth 305 (2007) 122-132 (Year: 2007).*

(Continued)

*Primary Examiner* — Hua Qi
(74) *Attorney, Agent, or Firm* — Behmke Innovation Group LLC; James M. Behmke; Jonathon P. Western

(57) ABSTRACT

A method of producing silicon carbide is disclosed. The method comprises the steps of providing a sublimation furnace comprising a furnace shell, at least one heating element positioned outside the furnace shell, and a hot zone positioned inside the furnace shell surrounded by insulation. The hot zone comprises a crucible with a silicon carbide precursor positioned in the lower region and a silicon carbide seed positioned in the upper region. The hot zone is heated to sublimate the silicon carbide precursor, forming silicon carbide on the bottom surface of the silicon carbide seed. Also disclosed is the sublimation furnace to produce the silicon carbide as well as the resulting silicon carbide material.

18 Claims, 5 Drawing Sheets

Related U.S. Application Data

(60) Provisional application No. 61/874,597, filed on Sep. 6, 2013.

(56) References Cited

U.S. PATENT DOCUMENTS

| | | | |
|---|---|---|---|
| 2002/0023581 A1 | 2/2002 | Vodakov et al. | |
| 2002/0083892 A1 | 7/2002 | Kondo | |
| 2003/0094132 A1 | 5/2003 | Vodakov et al. | |
| 2006/0102068 A1 | 5/2006 | Tsevtkov et al. | |
| 2007/0283880 A1 | 12/2007 | Tsevtkov et al. | |
| 2008/0026591 A1 | 1/2008 | Kordina et al. | |
| 2011/0214606 A1 | 9/2011 | Kondo | |
| 2012/0103249 A1 | 5/2012 | Gupta | |
| 2012/0032150 A1 | 12/2012 | Seki et al. | |
| 2014/0220298 A1* | 8/2014 | Loboda .................. | C23C 14/22 118/728 |

FOREIGN PATENT DOCUMENTS

| | | |
|---|---|---|
| JP | S61-024472 | 2/1986 |
| JP | H06-31699 A | 11/1994 |
| JP | 2003-523918 | 8/2003 |
| JP | 2009-274933 | 11/2009 |
| JP | 2011168431 A | 9/2011 |
| WO | WO-2001/063020 | 8/2001 |
| WO | WO-2014/123636 | 8/2014 |
| WO | WO-2014123636 A1 | 8/2014 |

OTHER PUBLICATIONS

International Search Report dated Dec. 22, 2014 issued in connection with PCT/US2014/054255.

Wang et al., "Increase of SiC sublimation growth rate by optimizing of powder packaging", Journal of Crystal Growth 205 (2007) 122-132.

Office Action dated Nov. 30, 2017 in connection with Chinese Application No. 201480049097.3.

Japanese Office Action dated May 9, 2018 in connection with Japanese Application No. 2016-540410.

English translation of Examination Report dated May 15, 2019 in connection with Taiwanese Application No. 108100545.

* cited by examiner

METHOD FOR PRODUCING BULK SILICON CARBIDE

CROSS-REFERENCE TO RELATED APPLICATIONS

The present application is a continuation application of and claims the benefit of priority to U.S. patent application Ser. No. 14/478,432, filed on Sep. 5, 2014, which claims the benefit of priority to U.S. Provisional Patent Application No. 61/874,597, filed on Sep. 6, 2013.

BACKGROUND OF THE INVENTION

1. Field of the Invention

The present invention relates to a sublimation furnace and methods for preparing bulk silicon carbide with low defect density.

2. Description of the Related Art

Silicon carbide (SiC) has gained significant interest in recent years due to its outstanding chemical, physical, and electrical properties. In particular, bulk single crystal SiC has been found to be useful in semiconductor applications, including, for example, as a substrate for material for components in power electronics, and LEDs. Other applications for this material are also emerging.

Silicon carbide can be prepared by a variety of methods known in the art. For example, large single crystals of silicon carbide have been prepared using a physical vapor transport (PVT) method. For this method, a source, such as powdered silicon carbide, is provided in a high temperature region of a crystal growth furnace and heated. Also, a seed, such as a silicon carbide single crystal wafer, is provided in a lower temperature region. The silicon carbide is heated to sublime, and the resulting vapors reach the cooler silicon carbide seed upon which material is deposited. Alternatively, the source can be a mixture of silicon and carbon particles, which, upon heating, react to form SiC that subsequently sublimes and recrystallizes on the seed.

While large boules of silicon carbide can be produced using a crystal growth furnace, the process is often difficult to control. For example, it is critical that the process conditions, such as the temperature gradient between the source and the seed, be held constant throughout the crystal growth process, which takes place typically over several days at greater than 2000° C., in order to produce a boule having consistent properties throughout. Small variations in process conditions can result in large changes to the quality of the grown silicon carbide boule. Also, as growth proceeds, sublimation of the seed and/or the growing crystal can occur if process conditions are not properly controlled. In addition, product quality can be affected by the types of components used in the crystal growth chamber, since, depending on the growth conditions, some may decompose and thereby chemically interfere with the growth. As a result, silicon carbide grown in a sublimation furnace often contains defects in the crystals, such as low angle grain boundaries, dislocations, Si and C second phase inclusions, different polytype inclusions, and micropipes, which affect the performance properties of the material. Furthermore, even if specific conditions can be maintained for a single crystal growth process to produce a high quality product, run to run variability is also typically seen since, for example, any variability in the source, the seed, or components of the apparatus can produce inconsistencies in the product.

For this reason there has not been to date a reliable and repeatable silicon carbide sublimation furnace or method that can efficiently and cost-effectively produce high quality large silicon carbide single crystals. Therefore, there is a need in the industry for an improved silicon carbide growth apparatus and method.

SUMMARY OF THE INVENTION

The present invention relates to a method of producing silicon carbide. The method comprises the steps of providing a sublimation furnace comprising a furnace shell, at least one heating element positioned outside the furnace shell, and a hot zone positioned inside the furnace shell surrounded by insulation. The hot zone comprises a crucible having an upper region and a lower region, a crucible cover sealing the crucible, a substantially solid silicon carbide precursor positioned in the lower region of the crucible, and a seed module positioned in the upper region of the crucible, the seed module comprising a silicon carbide seed having a top surface and a bottom surface exposed to the upper region of the crucible, with the bottom surface facing the substantially solid silicon carbide precursor. The method further comprises the steps of heating the hot zone with the heating element to sublimate the substantially solid silicon carbide precursor and forming silicon carbide on the bottom surface of the silicon carbide seed. Preferably, the seed module comprises a seed holder having at least one vapor release opening, and the silicon carbide seed is positioned within the seed holder. Also, preferably, the silicon carbide seed comprises at least one seed protection layer on the top surface of the seed. Various embodiments of the method are described.

It is to be understood that both the foregoing general description and the following detailed description are exemplary and explanatory only and are intended to provide further explanation of the present invention, as claimed.

DETAILED DESCRIPTION OF THE INVENTION

Figure 1:
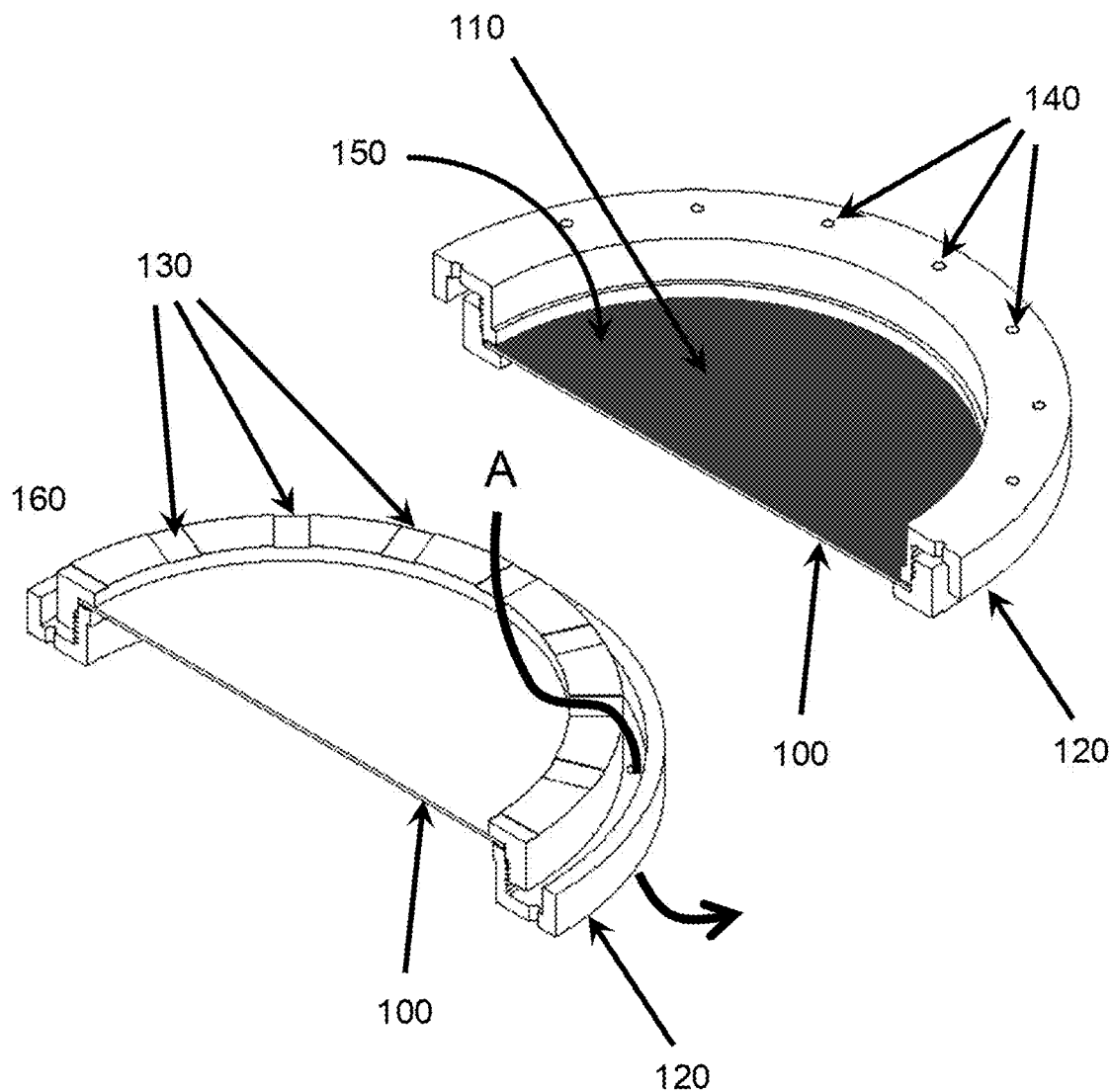
FIG. 1a and FIG. 1b are perspective views of a silicon carbide seed holder used in various embodiments of the present invention.

The present invention relates to a method and apparatus for producing silicon carbide.

In the method of forming silicon carbide of the present invention, a sublimation furnace is provided that comprises a furnace shell, a hot zone, and insulation surrounding the hot zone in the furnace shell. The furnace shell can be any known in the art used for high temperature crystallization furnaces, including a quartz shell comprising an outer wall and an inner wall defining a cooling channel for circulation a cooling fluid, such as water. In addition, the furnace shell may also be a single-walled quartz shell with air cooling, such as from the bottom of the shell to the top. The furnace shell is surrounded by at least one heating element which provides heat to promote and control crystal growth.

The hot zone comprises a crucible with a crucible cover or lid and both a silicon carbide precursor (sometimes referred to herein as a silicon carbide source) and a silicon carbide seed positioned within the crucible. Each of these is described in more detail below. Insulation surrounds the hot zone when positioned inside the furnace shell and can be any material known in the art that possesses low thermal conductivity that is further capable of withstanding the temperatures and conditions within the furnace, including, for example, graphite. Preferably, the insulation comprises a plurality of layers of fibrous insulation, such as graphite felt, and the number of layers can vary depending on, for example, the thickness of the layer, the size of the furnace shell, the size and shape of the crucible, the crystal growth conditions, and cost. Preferably, the shape and dimension of the insulation layers conform to the shape and size of the crucible used and provides a sufficiently low thermal conductivity to maintain the desired thermal gradient for crystal growth. For example, for a cylindrical crucible, preferably the insulation comprises layers of fibrous insulation material having a donut shape that are stacked to surround the crucible. Preferably, the hot zone surrounded by insulation is enclosed within a holding container, such as a quartz container, for ease of handling and to maintain consistently low thermal conductivity. Any gap present between the outside of the holding container and the inner surface of the furnace shell can be filled with an inert gas or gas mixture, such as a combination of argon and nitrogen.

For the present method, the furnace shell, hot zone, and insulation can be combined in a variety of ways. For example, in one embodiment, the insulation is provided within an open-topped holding container and positioned within the furnace shell (such as on a movable or stationary pedestal), having heating elements around the outside of the shell, and the hot zone, comprising the crucible sealed with the crucible cover and containing the silicon carbide precursor and the silicon carbide seed is positioned inside the insulation so that the insulation surrounds the hot zone. Alternatively, in another embodiment, the insulation is positioned inside the furnace shell, preferably within a holding container, and the crucible is positioned within the insulation. The silicon carbide source and the silicon carbide seed is then placed within the crucible, which can then be sealed with the crucible cover. Furthermore, in another embodiment, the insulation is positioned around the hot zone, either with or without the source and seed, and, together, the hot zone and insulation are positioned inside the furnace shell, preferably with the use of a holding container. Regardless of the order, preferably the hot zone is positioned horizontally (for example, axially) in the center of the furnace shell along a vertical center axis of the shell. Vertical positioning along this center axis depends, for example, on the type and location of the heating elements, described below, as well as the desired thermal gradient to be produced. Preferably, the hot zone is vertically positioned at or above the center of the furnace shell as well as the center of the heating elements surrounding the furnace shell. Specific vertical positioning can be adjusted for optimal growth performance. After the crucible is provided with the silicon carbide source and seed, the crucible can then be sealed with the cover. Other combinations are also possible and would be known to one of ordinary skill in the art. Optionally a porous filter, such as a porous graphite filter, may be positioned between the silicon carbide precursor and the silicon carbide seed.

Once the sublimation furnace has been assembled, the method of the present invention further comprises the step of heating the hot zone with the heating elements in order to sublimate the silicon carbide precursor, thereby forming silicon carbide on the silicon carbide seed. The heating elements can be any known in the art capable of changing the temperature within the furnace shell and, more particularly, within the crucible to cause sublimation of the source. The heating element may be a single element or can comprise multiple elements, which may be preferred for increased control. Preferably, for the present invention, the heating elements are induction heaters which wrap around the outside of the furnace shell and are capable of inductively coupling with components within the furnace shell, especially the crucible. In addition, in order to measure, maintain, and/or control the temperature within the crucible, the hot zone may further comprise at least one thermal sight tube positioned above the crucible. Preferably the tube passes through the crucible cover to a position above the silicon carbide seed. From there, temperature values can be measured and, if necessary, power to the heating elements can be changed to ensure that desired crystal growth conditions are maintained.

As described above, the hot zone comprises a crucible, a crucible cover, a silicon carbide precursor, and a silicon carbide seed. The crucible can be any crucible known in the art capable of withstanding the conditions present within the sublimation furnace. Preferably the crucible and the crucible lid comprise graphite. In addition, the crucible can have any shape or size, depending, for example, on the shape and size of the furnace shell, on the amount of silicon carbide precursor used, and on the desired shape and size of the silicon carbide product to be formed. For example, the crucible can have a substantially cylindrical shape. The crucible has an upper region (which is a region at the top of the crucible) and a lower region (which is a region at the bottom of the crucible), and these regions can have the same or different shape and/or cross-sectional area. For example, both the upper region and lower region of the crucible can have a substantially cylindrical shape, with the upper region having a larger diameter than the lower region. In this example, the insulation can fit snuggly against both the upper and lower regions, thereby being in contact with the entire outer surface of the crucible, or, preferably, the insulation can fit tightly against the upper region but not against the lower region of the crucible, thereby leaving a gap between the lower part of the crucible and the insulation. The silicon carbide precursor is positioned in the lower region of the crucible while the silicon carbide seed is positioned in the upper region of the crucible. In this way, when the hot zone is heated by the heating elements surrounding the furnace shell, the silicon carbide precursor reacts and/or sublimates to form silicon and carbon containing vapors, which then travel upward through the hot zone toward the silicon carbide seed, upon which the vapors condense and resolidify, thereby forming the silicon carbide product.

The silicon carbide precursor can be positioned directly into the lower region of the crucible or, alternative can be provided in a separate stand-alone container that is positioned in the lower region. For example, the silicon carbide precursor can be contained within a source module that is positioned within the crucible. The source module, which can have one or more precursor chambers, can be any container capable of withstanding the conditions needed to form silicon carbide and further that does not interfere with or add contaminants to the product. Preferably, the source module comprises graphite. The shape of the module can vary depending on, for example, the amount of the precursor charge and the shape of the crucible. For example, the source module can be a cylindrical insert provided to form an annular chamber in the lower region of the crucible. In this way, the outer annular chamber, which is closer to the heating elements, can contain the silicon carbide precursor while the interior cylindrical chamber provides space for passage of the sublimation products to reach the silicon carbide seed. Preferably, for this embodiment, the cylindrical source module comprises porous graphite capable of permitting diffusion of vapors produced by sublimation of the silicon carbide precursor.

The silicon carbide precursor comprises silicon carbide and can be in any form, including a powder, granular, solid, or a combination thereof. Preferably, the silicon carbide precursor is substantially solid, having a very low level of particulate material, including, for example, less than 10% particulate material, less than 5% particulate material, and less than 1% particulate material. Most preferably the silicon carbide precursor is a solid material having substantially no particulate material. In addition, the precursor can also be either a porous, low density solid or a non-porous, high density solid, compared to the density of silicon carbide.

The silicon carbide precursor can be prepared in a variety of different ways. For example, a reagent mixture comprising silicon and carbon, such as graphite, can be prepared and subsequently heated to form a substantially solid precursor silicon carbide precursor mixture comprising silicon carbide. Alternatively, particulate silicon carbide can be provided and also heated to be converted to a substantially solid silicon carbide precursor. The extent of conversion can be varied by, for example, the extent of heating, the temperature, and, for a reagent mixture, the ratio of silicon to carbon and the form of the mixture. For example, silicon particles and carbon particles can be combined to form a particulate mixture, which increases the surface area available for reaction to form the silicon carbide of the precursor. Preferably, a molar excess of carbon is used in order to drive conversion of the silicon to silicon carbide. For example, the molar ratio of carbon to silicon used for preparing the silicon carbide precursor is preferably greater than 1.0, more preferably from about 1.05 to about 1.5, and most preferably from about 1.1 to about 1.3.

Any known particulate silicon carbide or silicon and carbon particles can be used to prepare the silicon carbide precursor. For example, when a particulate mixture is used, preferably, the silicon particles have an average particle size of from about 0.1 mm to about 10 mm, more preferably from about 0.5 mm to about 5 mm, and most preferably from about 1 mm to about 4 mm. In addition, preferably the carbon particles have an average particle size in the range of from about 50 microns to about 1000 microns, more preferably from about 75 microns to about 750 microns, and most preferably from about 85 microns to about 500 microns. Particles in these ranges can be prepared using any method available in the art, including, for example, by sieving.

The particulate mixture can be formed either as a homogeneous or near-homogenous mixture of silicon and carbon particles, such as by combining reagent particles and agitating or mixing, or as a heterogeneous mixture, by combining reagent particles without intentional mixing. For example, the silicon particles and carbon particles can be combined in alternating layers of silicon and carbon, wherein each carbon layer has substantially equal amounts of carbon and each silicon layer has substantially equal amounts of silicon. The particulate mixture can be provided in the lower region of the crucible, as described above, and heated or, alternatively, can be provided in a source module, as described above, which can either be positioned in the crucible and heated or can be heated separately and then positioned in the lower region of the crucible.

The hot zone further comprises a silicon carbide seed positioned in the upper region of the crucible upon which silicon carbide is formed. The seed is monocrystalline in order to ensure formation of a substantially single crystal silicon carbide. Any seed known in the art may be used. Preferably the silicon carbide seed is a silicon carbide wafer, particularly a circular silicon carbide wafer, such as is available by slicing a silicon carbide boule. The diameter of the silicon carbide seed wafer can vary depending a variety of factors, such as the size of the crucible and the desired size of silicon carbide to be produced. For example, silicon carbide seed can be a circular silicon carbide wafer having a diameter that is greater than about 75 mm (such as from about 80 mm to about 85 mm), greater than about 100 mm (such as from about 105 mm to about 115 mm), greater than about 150 mm (such as from about 160 mm to about 170 mm), and greater than about 200 mm (such as from about 210 mm to about 230 mm). The thickness of the silicon carbide seed can also vary depending on such factors as cost and availability. For example, the silicon carbide seed can be a circular silicon carbide wafer having a thickness of from about 0.5 mm to about 3.5 mm, such as from about 0.6 mm to about 1.3 mm and from about 0.7 mm to about 1.1 mm.

The silicon carbide seed has a top surface and a bottom surface and is positioned in the upper region of the crucible with the bottom surface facing the silicon carbide precursor that is positioned in the bottom region of the crucible. Since the seed is monocrystalline silicon carbide, the seed has a silicon face and a carbon face, and the seed can be positioned so that either face is directed towards the precursor, depending on the polytype of silicon carbide to be formed. For example, 6H silicon carbide can be formed when the silicon face of a silicon carbide seed wafer is the bottom face while 4H silicon carbide can be grown from the carbon face of the seed wafer. Preferably the silicon carbide seed is provided in a separate stand-alone seed module, and the seed module is positioned in the upper region of the crucible. The seed module can be any container capable of withstanding the silicon carbide crystal growth conditions and can further contain the silicon carbide seed, holding the seed in position without interfering with the silicon carbide growth. Preferably, the seed module comprises a seed holder that contains the seed while leaving the bottom surface of the seed, upon which silicon carbide grows, exposed to the upper region of the crucible. Preferably, up to 75% of the bottom surface is exposed, more preferably 80%, and most preferably 90%. In this way, the crystal growth surface exposure is maximized.

In addition, preferably the top surface of the silicon carbide seed contained within the seed holder is also exposed to the upper region of the crucible. In particular, greater than about 75% of the top surface of the seed is exposed in the seed holder, including greater than about 80% and greater than about 90%. This is contrary to what is typically done in the art. One of ordinary skill would adhere the top surface of the seed to a protective barrier, such as a thick graphite block which can act as the lid of the crucible. Leaving the top surface of the seed exposed would be expected to decompose the seed and produce defects within the growing silicon carbide crystal. However, adhering the seed to a block has significant disadvantages, particularly since a thermal mismatch between the block and seed creates stresses and defects within the growing crystal. Furthermore, adhesives capable of surviving the growth conditions add further cost to the process and can add contaminants to the seed growing environment.

Surprisingly it has been found that the top surface of the silicon carbide seed can be left exposed to the upper region of the crucible, the exposed surface being unattached to or suspended from any component above the seed within the hot zone, including the crucible or crucible lid, and that, as a result, silicon carbide can be formed on the seed with reduced overall crystal defects. In order to ensure that the top surface of the silicon carbide seed does not deteriorate during the silicon carbide growth, it is preferred that the top surface of the seed comprises a seed protection layer, which can act as a barrier to the crystal growth environment in the upper region of the crucible. More preferably, the entire top surface of the silicon carbide seed comprises the seed protection layer. This layer can be a single layer or may comprise multiple layers but overall is very thin relative to the thickness of the seed. Preferably, the seed protection layer has a thickness of less than about 250 microns and more preferably is less than about 100 microns thick, such as from about 10 microns to about 90 microns, from about 30 microns to about 80 microns, and from about 50 microns to about 70 microns. The seed protection layer can comprise any material capable of preventing reaction with the top surface of the seed without imparting undesired thermal stress, particularly due to a mismatch in coefficient of thermal expansion. For example, the seed protection layer may comprise one or more carbonaceous layers, such as a coating comprising graphite or a photoresist layer that has been cured at high temperature. When the seed protection layer comprises at least two coating layers, the thickness of the layers can vary as long as the overall thickness preferably remains below about 250 microns. For example, each layer can be from about 1 micron to about 100 microns, including from about 2 microns to about 5 microns when the layer is a cured photoresist and from about 20 microns to about 30 microns when the layer is a graphite coating layer.

The seed protection layer can be applied to the silicon carbide seed surface using any coating technique known in the art that is capable of producing a thin surface layer. Thus, in one embodiment of the method of the present invention, a seed module is provided by a method comprising the step of applying at least one coating to a surface of the silicon carbide seed and optionally curing the resulting coating, depending on the material used. The surface can be either the silicon face of the seed or the carbon face of the seed. Once coated, the surface comprising the seed protection layer is used as the top surface of the seed, and the seed, preferably contained within a seed module, is positioning in the crucible with this protected surface exposed to the upper region of the crucible.

A variety of different types of seed holders can be used, and the holder can be made of any material capable of withstanding the high temperature conditions needed for silicon carbide crystal growth, including, for example, graphite. Preferably, for the method of the present invention, the seed holder comprises one or more vapor release openings, which are spaces provided in the holder to allow vapors produced, such as from the sublimation of the silicon carbide precursor, to vent out from crucible. Preferably, the vapor release openings are provided below the bottom surface of the silicon carbide seed when contained within the seed holder and adjacent to or outside of the periphery of the seed, thereby allowing excess vapors to travel upwardly toward and around the seed and then out of the crucible, which also preferably comprises one or more vent holes to allow the vapor to pass through. Furthermore, a vapor release ring may also be included, either within the seed holder or between the outside of the seed holder and the crucible wall. The ring comprises one or more holes that can be aligned with the vent holes in the crucible. Upper vapor release holes in the top portion of the seed holder can also be used. Adjustment of the ring can vary the amount of vapor that is vented from the crucible and into the surrounding insulation by changing the alignment of the holes.

The number of vapor release openings of the seed holder can be varied, as can their shape and size, and the openings can be located at various positions on the seed holder. For example, the seed holder can comprise a plurality of vapor release openings that are positioned around a center axis of the holder that is perpendicular to the bottom surface of the silicon carbide seed. In particular, for a silicon carbide seed that is a circular wafer, the plurality of vapor release openings can be symmetrically positioned around the outside of the seed equidistant from the center axis. The shape of the openings can be, for example, circular, oval, rectangular, or square, and the openings can be positioned within the body of the seed holder or along an edge. As a particular example, the seed holder can comprise a plurality of square vapor release openings symmetrically positioned around the bottom edge of the seed holder facing the source, forming essentially the shape of a castle turret.

Thus, the method of forming silicon carbide of the present invention comprises the steps of providing a sublimation furnace comprising a furnace shell, insulation, and hot zone, the hot zone comprising a crucible having a silicon carbide precursor in the lower region and a silicon carbide seed in the upper region. In one embodiment, the silicon carbide precursor is contained within a source module and/or the silicon carbide seed is contained within a seed module. These modules can be prepared outside of the crucible in separate steps and then later positioned therein. As such, the source, the seed, or both can be provided as prepackaged components that are separate from the sublimation furnace. The source is consumed during the silicon carbide preparation, and the silicon carbide seed becomes part of the grown silicon carbide product and is removed with the produced material. Thus, one method of the present invention is a consumable process for preparing silicon carbide in the hot zone of a sublimation furnace. The furnace is provided, the consumable source module and/or consumable seed module are positioned in the lower and upper regions, respectively, of the hot zone, silicon carbide is formed, and both source and seed are removed to be replaced by another source and seed for a subsequent silicon carbide preparation run.

A specific embodiment of the method of the present invention is described below. However, it should be apparent to those skilled in the art that this is merely illustrative in nature and not limiting, being presented by way of example only. Numerous modifications and other embodiments are within the scope of one of ordinary skill in the art and are contemplated as falling within the scope of the present invention. In addition, those skilled in the art should appreciate that the specific conditions and configurations are exemplary and that actual conditions and configurations will depend on the specific system. Those skilled in the art will also be able to recognize and identify equivalents to the specific elements shown, using no more than routine experimentation.

In a first example of the method of the present invention, a substantially solid silicon carbide precursor mixture was prepared by placing 660 gr of particulate silicon (sieved to a particle size range of 1.0-3.35 mm, average particle size 2.18 mm) and 340 gr of particulate carbon (sieved to a particle size range of 90-500 microns, average particle size 294 microns) into the outer annular chamber of a cylindrical graphite source module having a center annular wall of porous graphite that is positioned at the bottom of a cylindrical graphite crucible. The silicon and carbon particles are placed in alternating layers, each layer having approximately equal amounts of material (6 layers of carbon particles alternating with 5 layers of silicon particles). A porous graphite filter was positioned over the multiple layers, but not in contact with the precursor mixture, with a gap of approximately 20 mm, and the crucible was sealed with a crucible lid containing a cylindrical thermal sight tube. The partially filled crucible was then placed within a cylindrical quartz container, surrounded by multiple layers of soft graphite felt having a thickness of approximately 0.25 inches, filling the container, and the filled container was positioned in a furnace shell and heated by induction heaters positioned around the outside of the furnace shell to a temperature of approximately 1400° C. for 2 hours followed by a temperature of approximately 2240° C. for an additional 2 hours. The resulting substantially solid silicon carbide precursor mixture was used as is for preparing silicon carbide.

Separately, a seed module was prepared by applying a seed protection layer to the silicon face of a polished 80 mm silicon carbide wafer (thickness between 0.8 and 1.0 mm) and placing the protected seed in a seed holder. In particular, a first photoresist layer (Megaposit SPR, a viscous cresol novolak resin solution available from Rohm and Haas Electronic Materials) was coated onto the polished silicon face of the silicon carbide wafer and cured to form a first layer having a thickness of 2-4 microns. A second photoresist layer was then applied on top of the first layer and also cured (thickness was 2-4 microns). A carbonaceous layer was then applied by spray coating graphite (Aerodag G, a non-aqueous graphite spray dispersion) on the second photoresist layer at approximately 120° C. (thickness was 20-30 microns). The composite was then heated to 1150° C. for 2 hours under vacuum to ensure full cure and coverage. A third photoresist layer was also applied to the porous carbonaceous layer, adding minimal thickness as the photoresist layer filled the porous layer, followed by spray coating of a second graphite layer (thickness was 20-30 microns) as a sealant. The entire composite was finally heated to 300° C. for 8 hours at atmospheric pressure under nitrogen to produce a silicon carbide seed wafer having a multilayer seed protection on its silicon face.

The protected silicon carbide seed was placed in a graphite seed holder comprising multiple vapor release openings, thereby forming the seed module. This is shown in FIG. 1a, which is a view of the top of a seed module and FIG. 1b, which is a view of the bottom. Thus, silicon carbide seed 100, comprising seed protection layer 110 on the silicon face, prepared as described above, was positioned in seed holder 120 comprising a plurality of rectangular vapor release openings 130 symmetrically positioned around the bottom periphery of the holder in a castle turret configuration. In addition, seed holder 120 further comprises additional vapor release openings 140 in the top portion of the holder, which can be aligned with vent holes in the crucible, shown in FIG. 2 and discussed below. Vapors produced by sublimation of a silicon carbide precursor can therefore approach silicon carbide seed 100 and escape through vapor release opening 130 and additional vapor release openings 140 through vent holes in the crucible and out into the surrounding insulation, such as is illustrated by path arrow A. Silicon carbide seed 100 is placed in seed holder 120 with seed protection layer 110 facing up, making the bottom surface of the seed the carbon face to grow 4H silicon carbide. As can be seen in FIG. 1a and FIG. 1b, top surface 150 and bottom surface 160 of silicon carbide seed 100 are exposed in seed holder 120.

Figure 2:
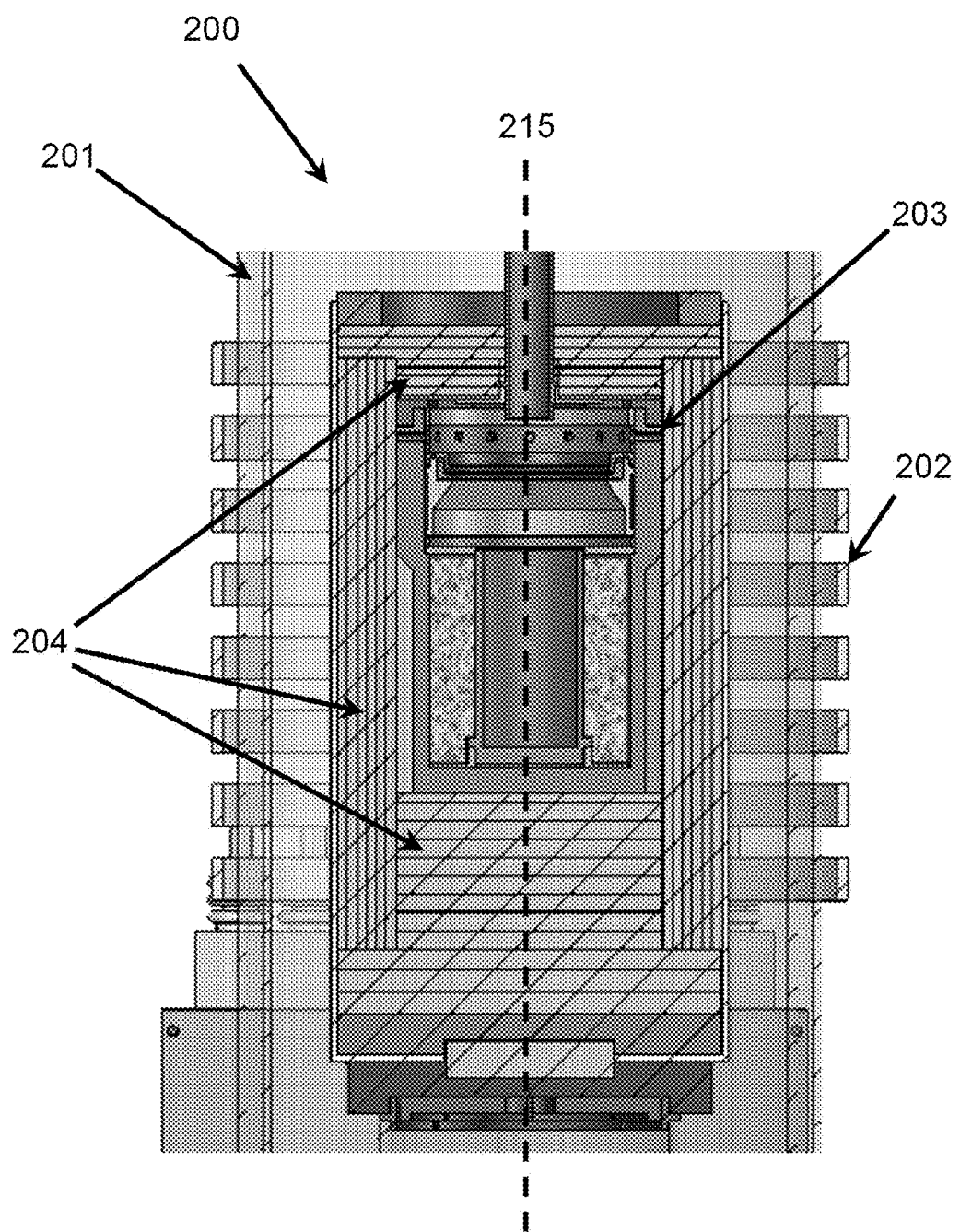
FIG. 2 is a schematic view of a sublimation furnace used in various embodiments of the present invention.
Figure 3A:
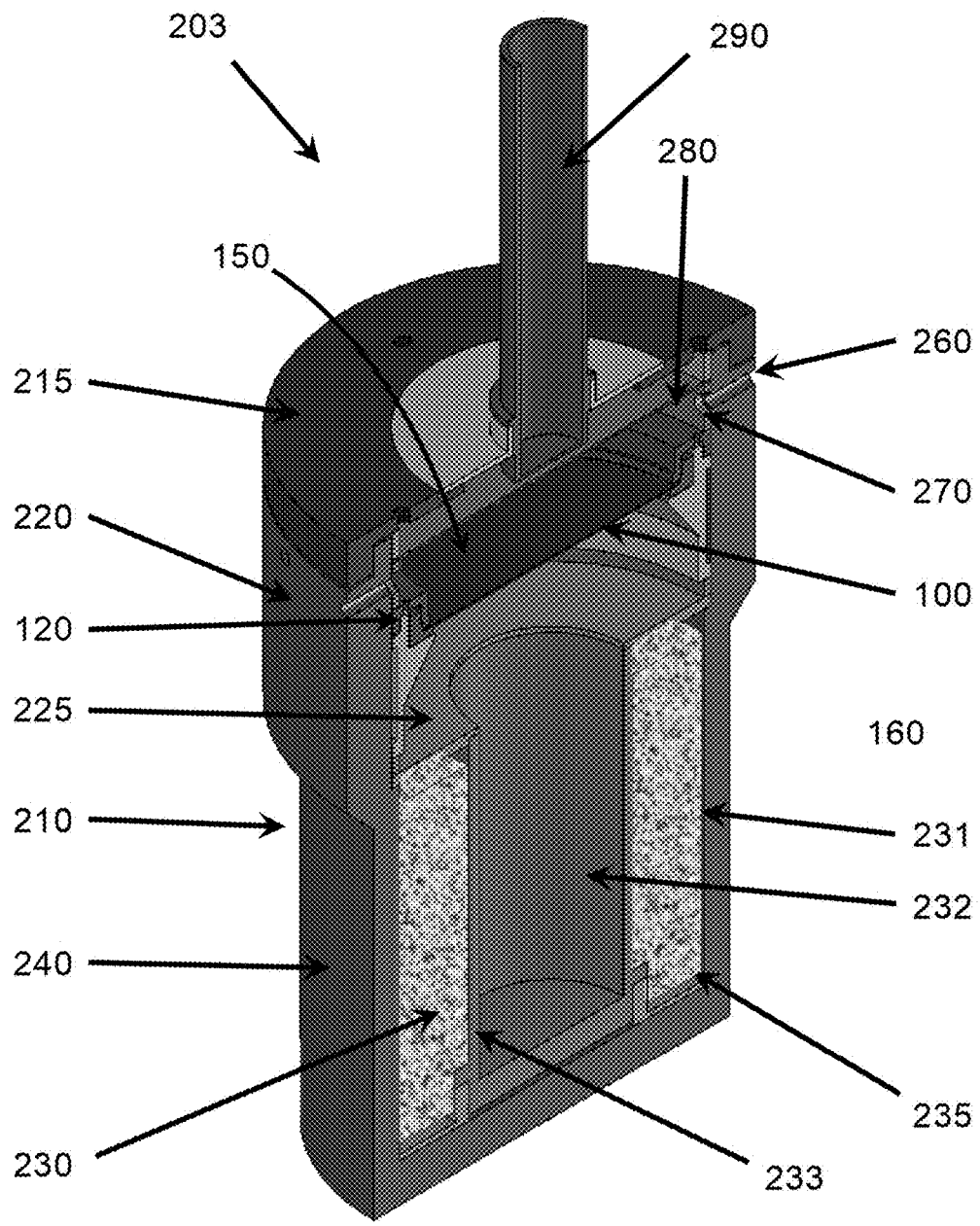
FIG. 3a and FIG. 3b show various views of a hot zone of a sublimation furnace used in various embodiments of the present invention.
Figure 3B:
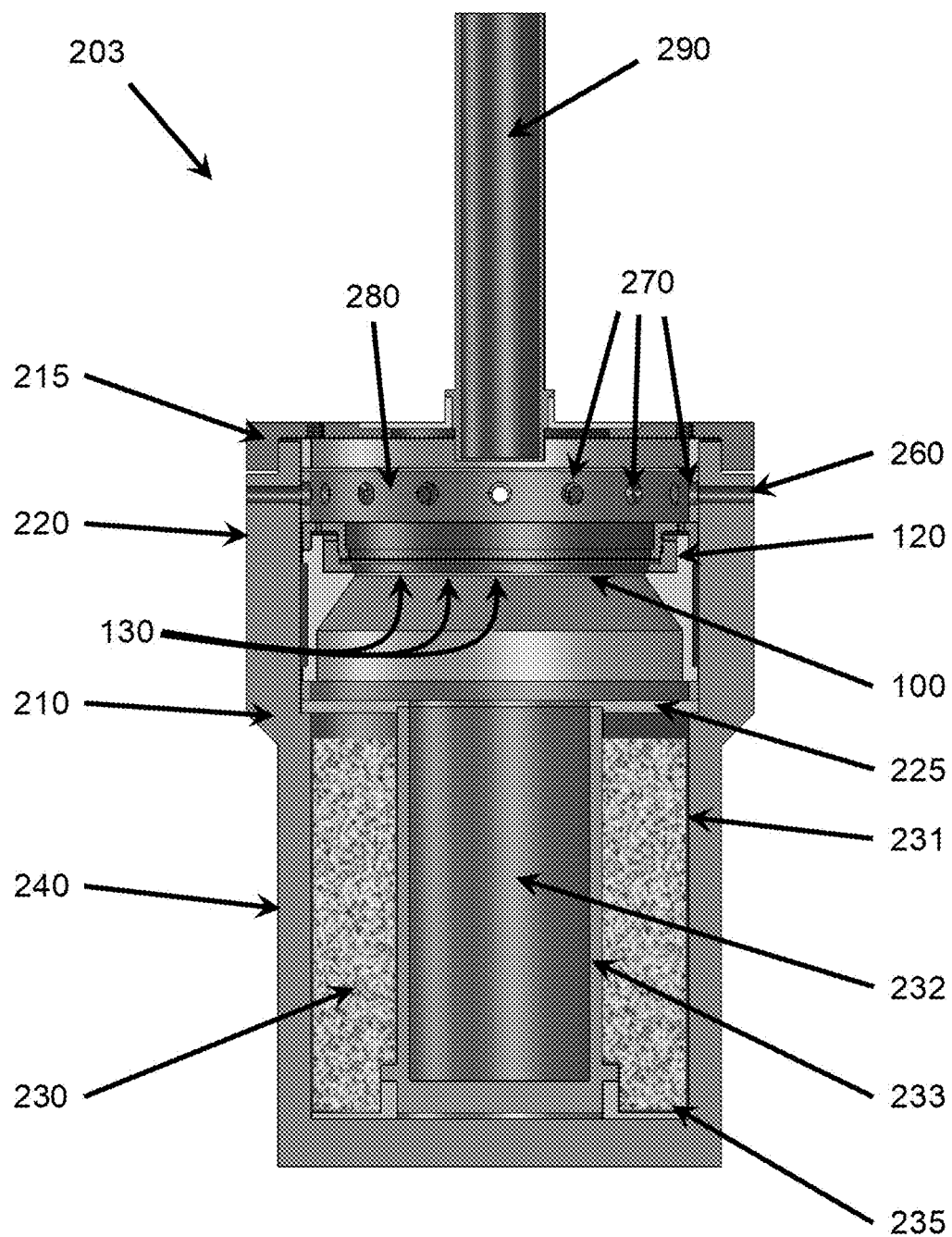

FIG. 2 is a schematic view of sublimation furnace 200 which comprises furnace shell 201 surrounded by induction heating elements 202 and further comprises hot zone 203 within furnace shell 201, positioned along center axis 215 of furnace shell 201 slightly above the middle of induction heating elements 202 and surrounded by insulation 204, which comprises a plurality of layers of graphite felt. Hot zone 203 and insulation 204 are enclosed in quartz container 205, with gap 206 filled with a mixture of argon and nitrogen. As shown in FIG. 3a and FIG. 3b, hot zone 203 comprises crucible 210 made of graphite having a generally cylindrical shape, with the diameter at upper region 220 being greater than the diameter at lower region 240. Seed holder 120, comprising silicon carbide seed 100, is positioned in upper region 220 of crucible 210, with both top surface 150 and bottom surface 160 of silicon carbide seed 100 being exposed to upper region 220. Bottom surface 160 faces substantially solid silicon carbide precursor mixture 230 positioned in lower region 240 of crucible 210, which is prepared as described above in outer annular chamber 231 of source module 235 having an open annular region 232 formed by porous graphite wall 233. Substantially solid silicon carbide precursor mixture 230 is separated from seed holder 120 by porous graphite filter 225, which, as shown, is not in contact with the source or seed. Seed holder 120 comprises rectangular vapor release openings 130 (not visible in the view provided in FIG. 3a), which provide a path for vapors to pass out of crucible 210 through vent holes 260 and aligned holes 270 in vapor release ring 280. Crucible 210 is sealed with crucible cover 215 in which is inserted thermal sight tube 290 positioned over silicon carbide seed 100 for monitoring the temperature within hot zone 203.

In this exemplary method of the present invention, after preparing sublimation furnace 100, hot zone 203 is heated with induction heating elements 202 to a temperature of between 2080° C. to 2110° C. while simultaneously decreasing the reaction pressure to about 0.5 Torr, and these conditions are maintained for approximately 100 hours (with the temperature holding within a range of 50° C.). A temperature gradient is established within the crucible, being hotter in lower region 240 than upper region 220 by approximately 20-40° C. In this way, substantially solid silicon carbide precursor mixture 230 is sublimated and bulk silicon carbide was formed on bottom surface 160 of silicon carbide seed 100, with excess vapors venting through vapor release openings 130.

Similarly, in a second example, 1050-1150 gr of particulate SiC (Poly alpha-SiC, available from Washington Mills) was placed into the outer annular chamber of a cylindrical graphite source module and positioned in a graphite crucible and within a furnace shell, as described in the previous example. The SiC was then heated to a temperature of approximately 1400° C. for 2 hours followed by a temperature of approximately 2240° C. for an additional 2 hours to produce a substantially solid silicon carbide precursor having a density of approximately 1.1 gr/L. Separately, a seed module comprising a 100 mm silicon carbide wafer, with a seed protection layer applied to its silicon face and contained within a seed holder, was also prepared, using a method similar to that described in the previous example. In particular, a first photoresist layer (Megaposit SPR) was coated onto the polished silicon face of a silicon carbide wafer and cured to form a first layer having a thickness of 2-4 microns. Then a carbonaceous layer was applied by spray coating graphite (Aerodag G) onto the first photoresist layer (total thickness was 20-30 microns). The composite was heated to 1150° C. for 2 hours under vacuum to ensure full cure and coverage. This process was repeated to produce a silicon carbide seed wafer having a multilayer seed protection on its silicon face. The protected seed was then place in the graphite seed holder used in the previous example and positioned in the upper region of the graphite crucible, with both faces of the seed being exposed to the upper region, as shown in FIG. 3a and FIG. 3b. The resulting hot zone was surrounded by insulation comprising a plurality of layers of graphite felt having a thickness of approximately 0.25 inches and having very low thermal conductivity (0.15 W/(° K·m) at 1000° C.), and the combination was placed in a quartz container and axially centered in the sublimation furnace shown in FIG. 2 above the middle of induction heating elements. Bulk silicon carbide was formed on the bottom surface of the silicon carbide seed as described above.

The resulting silicon carbide can vary in shape and size depending, for example, on the size of the silicon carbide precursor, the size of the exposed area of the bottom surface of the silicon carbide seed, and the relative shape of the crucible. For example, the grown silicon carbide can be in the form of a boule having a substantially circular cross-sectional shape in a direction parallel to the bottom surface of the silicon carbide seed. The boule can increase in diameter in a direction perpendicular from the seed surface to a maximum diameter and further decrease in diameter to a rounded point, forming a generally conical bottom surface. The maximum diameter of the silicon carbide boule can vary depending, for example, on the length of time silicon carbide is grown and on the growth conditions. Generally, the maximum diameter is from about 70 mm to about 250 mm. For example, the maximum diameter can be greater than 75 mm (such as from about 80 mm to about 85 mm), including greater than about 100 mm (such as from about 105 mm to about 115 mm), greater than about 150 mm (such as from about 160 mm to about 170 mm), and greater than about 200 mm (such as from about 210 mm to about 230 mm). The boule weight depends on growth conditions but is generally from about 60%-80% of the initial weight of the source material.

Figure 4:
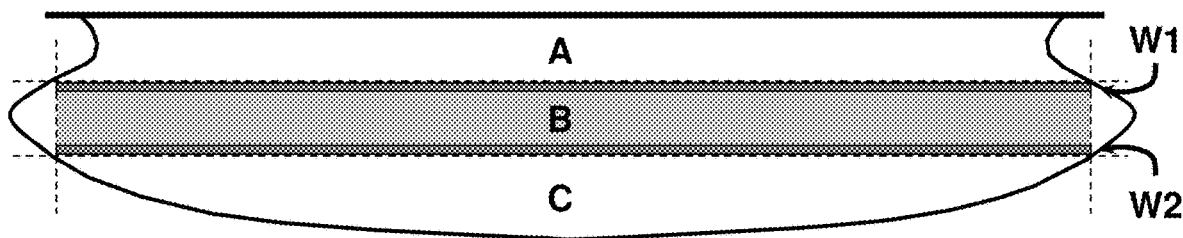
FIG. 4 shows a cross-sectional view of a silicon carbide boule produced by an embodiment of the present invention.

For example, the bulk silicon carbide produced in the second example was a boule having a circular horizontal cross section and a shape shown in FIG. 4. As shown, the boule has a top section A having a curved outer surface that increases in diameter from the initial silicon carbide seed wafer on top to the approximate center of middle section B, which is the widest section of the boule, having a maximum diameter of approximately 112 mm. The rounded outer surface of middle section B can be ground down to a flat surface (as shown) for wafer production. The boule is capped by dome section C, which has a shiny outer surface as grown. For this example, the grown silicon carbide boule had a weight of approximately 748 gr and a height of approximately 33 mm, with section A being approximately 10 mm, and sections B and C being approximately 12 mm.

Therefore, the present invention also relates to a bulk silicon carbide boule produced by the method of the present invention. Since the boule is grown on a silicon carbide seed as described above, the grown boule therefore includes this seed. Thus, in a specific embodiment of the present invention, a silicon carbide boule grown on a circular silicon carbide wafer has a generally bulbous shape with a substantially circular horizontal cross-sectional shape and comprises a flat outside surface, which comprises the circular silicon carbide wafer and therefore has one or more, preferably at least two, such as from 2-5, carbonaceous coatings. The bulk silicon carbide boule further has a middle section having a substantially circular cross-sectional shape in a direction parallel to the flat surface with a diameter slightly larger than the diameter of the flat surface, and a conical or dome-shaped outer surface opposite the flat outside surface. The conical outer surface preferably has a mirror-like finish.

The silicon carbide of the present invention, produced by the method of the present invention, has been found to have improved properties, particularly a generally low overall number of total defects, including, but not limited to, threading edge dislocations, threading screw dislocations, and basal plane defects (dislocations and stacking faults). For example, the silicon carbide has been found to have a total defect count of less than about 8000/cm$^2$ and, in particular less than about 6000/cm$^2$. In addition, the threading edge dislocation density of the silicon carbide has been found to be low, such as about 4000/cm$^2$ and, in particular less than about 2500/cm$^2$. Also, the silicon carbide has been found to have a threading screw dislocation density of less than about 3500/cm$^2$, including less than about 3000/cm$^2$. Furthermore, the basal plane defect density of silicon carbide of the present invention is also low, such as less than about 500/cm$^2$ or less than about 200/cm$^2$. Preferably, the silicon carbide produced by the method of the present invention has a threading edge dislocation density of less than about 2500/cm$^2$, a threading screw dislocation density of less than about 3000/cm$^2$, and a basal plane defect density of less than about 200/cm$^2$.

A plurality of silicon carbide wafers can be removed from the grown silicon carbide boule having the low defect levels, and the number of wafers will depend on the size of the middle section (having the maximum diameter), on the target wafer thickness, and on the method used to remove them. For the boule shown in FIG. 5, it would be expected that 7-10 wafers can be cut from middle section B, which can optionally be polished if needed. Each of these wafers, resulting from a boule having, on average, a low defect count, would be expected to have improved physical and performance properties, particularly for LED or power device applications. For example, 1.25 mm silicon carbide wafers were cut from section B of the boule shown in FIG. 4—one at the top (W1) and one from the bottom (W2). These were polished to a thickness of approximately 1.00 mm and analyzed for defect levels. The results are shown in Table 1 below:

TABLE 1

| Wafer | Threading Screw | Threading Edge | Basal Plane | Total Defects |
|---|---|---|---|---|
| W1 | 915 | 1001 | 143 | 2058 |
| W2 | 44 | 1210 | 477 | 1732 |

As the data shows, both wafers were found to have surprisingly low total defect counts. Furthermore, the total amount of defects decreased throughout section B, indicating that defects decreased as the growth proceeded. Threading screw dislocations, threading edge dislocations, and basal plane defects were all also surprisingly low. With such low defect levels in each wafer, all wafers from section B would be expected to having increased performance in, for example, LED and power electronics applications.

The present invention further relates to the sublimation furnace used in the method described above. The sublimation furnace comprises a furnace shell, at least one heating element positioned outside the furnace shell, and a hot zone positioned inside the furnace shell surrounded by insulation. The shell, heaters, insulation, and hot zone can be any of those described above. In particular, the hot zone comprises a crucible, a crucible cover sealing the crucible, a silicon carbide precursor positioned in the lower region of the crucible, and a silicon carbide seed positioned in the upper region of the crucible. Any of these components described above can be used in the sublimation furnace of the present invention, including, for example, a substantially solid silicon carbide precursor mixture, such as can be prepared by heating a particulate mixture comprising silicon and carbon particles, and a seed module comprising the silicon carbide seed, especially a seed having a top surface and a bottom surface exposed to the upper region of the crucible and wherein the top surface of the silicon carbide seed comprises a seed protection layer.

The foregoing description of preferred embodiments of the present invention has been presented for the purposes of illustration and description. It is not intended to be exhaustive or to limit the invention to the precise form disclosed. Modifications and variations are possible in light of the above teachings, or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of forming silicon carbide, comprising:
    providing a sublimation furnace comprising a furnace shell, at least one heating element positioned outside the furnace shell, and a hot zone positioned inside the furnace shell surrounded by insulation, the hot zone including:
        a crucible having an upper region, a lower region, and one or more vent holes,
        a crucible cover sealing the crucible,
        a solid silicon carbide precursor contained within a source module that is positioned in the lower region of the crucible, wherein the source module is removable from the crucible,
        a stand-alone seed module, removable from the crucible, that, when suspended in the upper region of the crucible, forms a space between the crucible cover and an entire top surface of an upper section of a seed holder of the seed module, the seed module having a plurality of vapor release openings and a silicon carbide seed disposed within the seed holder, wherein the plurality of vapor release openings are formed in the seed holder below a bottom surface of the silicon carbide seed as a plurality of holes around a center axis that is perpendicular to the bottom surface of the silicon carbide seed, and
        a vapor release ring having one or more holes, wherein at least one of the one or more holes of the vapor release ring is aligned with at least one of the one or more vent holes of the crucible;
    heating the hot zone with the at least one heating element to sublimate the solid silicon carbide precursor contained within the source module;
    forming the silicon carbide on the bottom surface of the silicon carbide seed;
    removing the seed module including the formed silicon carbide on the bottom surface of the silicon carbide seed; and
    removing the source module including the sublimated solid silicon carbide precursor.

2. The method of claim 1, wherein the source module comprises a precursor chamber, and wherein the solid silicon carbide precursor is contained within the precursor chamber.

3. The method of claim 1, wherein the solid silicon carbide precursor has a density that is less than a density of silicon carbide.

4. The method of claim 1, wherein a top surface of the silicon carbide seed comprises a seed protection layer.

5. The method of claim 4, wherein the seed protection layer has a thickness of less than 250 microns.

6. The method of claim 4, wherein the seed protection layer has a thickness of less than 100 microns.

7. The method of claim 4, wherein the seed protection layer comprises at least two coating layers.

8. The method of claim 4, wherein the seed protection layer comprises at least one cured coating layer.

9. The method of claim 1, wherein the silicon carbide seed has a silicon face and a carbon face, and wherein a top surface of the silicon carbide seed comprises the silicon face.

10. The method of claim 1, wherein the silicon carbide seed has a silicon face and a carbon face, and wherein a top surface of the silicon carbide seed comprises the carbon face.

11. The method of claim 1, wherein the hot zone is positioned along the center axis.

12. The method of claim 1, wherein the insulation comprises a plurality of layers of fibrous thermally insulating material including graphite felt.

13. The method of claim 1, wherein the crucible has a cylindrical shape.

14. The method of claim 1, wherein the upper region of the crucible has a cylindrical shape having an upper diameter, wherein the lower region of the crucible has a cylindrical shape having a lower diameter, and wherein the upper diameter is larger than the lower diameter.

15. The method of claim 1, wherein the at least one heating element comprises an induction heater.

16. The method of claim 1, wherein the silicon carbide formed is a silicon carbide boule having a circular cross-sectional shape in a direction parallel to the silicon carbide seed.

17. The method of claim 1, wherein the silicon carbide has a total defect count of less than $8000/cm^2$.

18. The method of claim 1, wherein the solid silicon carbide precursor is porous.

* * * * *